US011539138B2

(12) United States Patent
Kim et al.

(10) Patent No.: US 11,539,138 B2
(45) Date of Patent: Dec. 27, 2022

(54) CHIP RADIO FREQUENCY PACKAGE AND RADIO FREQUENCY MODULE

(71) Applicant: Samsung Electro-Mechanics Co., Ltd., Suwon-si (KR)

(72) Inventors: Hak Gu Kim, Suwon-si (KR); Ho Kyung Kang, Suwon-si (KR); Seong Jong Cheon, Suwon-si (KR); Young Sik Hur, Suwon-si (KR); Jin Seon Park, Suwon-si (KR); Yong Duk Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/505,743

(22) Filed: Oct. 20, 2021

(65) Prior Publication Data

US 2022/0037792 A1 Feb. 3, 2022

Related U.S. Application Data

(63) Continuation of application No. 16/891,265, filed on Jun. 3, 2020, now Pat. No. 11,183,765.

(30) Foreign Application Priority Data

Feb. 5, 2020 (KR) ........................ 10-2020-0013914

(51) Int. Cl.
*H03M 1/38* (2006.01)
*H01Q 9/04* (2006.01)
(Continued)

(52) U.S. Cl.
CPC ......... *H01Q 9/0414* (2013.01); *H01Q 1/2283* (2013.01); *H01Q 1/38* (2013.01); *H01Q 5/35* (2015.01)

(58) Field of Classification Search
CPC ...... H01Q 9/0414; H01Q 5/35; H01Q 1/2283; H01Q 1/38
(Continued)

(56) References Cited

U.S. PATENT DOCUMENTS 5,596,226 A 1/1997 Beilstein, Jr. et al.
7,141,884 B2 11/2006 Kojima et al.
(Continued)

FOREIGN PATENT DOCUMENTS

JP 3137565 B2 2/2001

*Primary Examiner* — Peguy Jean Pierre
(74) *Attorney, Agent, or Firm* — NSIP Law

(57) ABSTRACT

A chip radio frequency package includes a substrate including a first cavity, first and second connection members, a core member, a radio frequency integrated circuit (RFIC) disposed on an upper surface of the substrate, and a first front-end integrated circuit (FEIC) disposed in the first cavity. The core member includes a core insulating layer and a core via that penetrates the core insulating layer. The first connection member has a structure in which a first insulating layer and a first wiring layer are stacked. The second connection member has a second structure in which a second insulating layer and a second wiring layer are stacked. The RFIC inputs or outputs a base signal and a first radio frequency (RF) signal having a frequency higher than a frequency of the base signal, and the first FEIC inputs or outputs the first RF signal and a second RF signal.

20 Claims, 15 Drawing Sheets

(51) Int. Cl.
*H01Q 5/35* (2015.01)
*H01Q 1/38* (2006.01)
*H01Q 1/22* (2006.01)

(58) Field of Classification Search
USPC .......................................................... 343/702
See application file for complete search history.

(56) References Cited

U.S. PATENT DOCUMENTS

| | | | |
|---|---|---|---|
| 7,279,771 | B2 | 10/2007 | Sunohara et al. |
| 7,321,164 | B2 | 1/2008 | Hsu |
| 7,982,297 | B1 | 7/2011 | Heo |
| 8,132,320 | B2 | 3/2012 | Wang |
| 8,502,370 | B2 | 8/2013 | Chan et al. |
| 8,624,369 | B2 | 1/2014 | Nam et al. |
| 8,674,236 | B2 | 3/2014 | Higo et al. |
| 8,766,440 | B2 | 7/2014 | Kikuchi et al. |
| 9,049,791 | B2 | 6/2015 | Hurwitz et al. |
| 9,161,461 | B2 | 10/2015 | Hurwitz et al. |
| 9,252,031 | B2 | 2/2016 | Im et al. |
| 9,559,041 | B2 | 1/2017 | Ishihara |
| 9,627,309 | B2 | 4/2017 | Kobayashi et al. |
| 9,748,217 | B2 | 8/2017 | Ohba |
| 9,852,970 | B2 | 12/2017 | Kobayashi et al. |
| 9,859,201 | B2 | 1/2018 | Shimizu et al. |
| 10,325,841 | B2 | 6/2019 | Nakagawa et al. |
| 10,340,232 | B2 | 7/2019 | Aoki et al. |
| 10,453,804 | B2 | 10/2019 | Kamgaing et al. |
| 2004/0075616 | A1 | 4/2004 | Endo et al. |
| 2008/0136002 | A1 | 6/2008 | Yang |
| 2009/0051024 | A1 | 2/2009 | Chia |
| 2009/0250801 | A1 | 10/2009 | Isa et al. |
| 2012/0205142 | A1 | 8/2012 | Higo et al. |
| 2013/0147041 | A1 | 6/2013 | Chan et al. |
| 2014/0131450 | A1 | 5/2014 | Godon et al. |
| 2015/0022985 | A1 | 1/2015 | Na et al. |
| 2016/0081194 | A1 | 3/2016 | Sato et al. |
| 2016/0322294 | A1 | 11/2016 | Kobayashi et al. |
| 2019/0019758 | A1 | 1/2019 | Kim et al. |
| 2021/0313284 | A1* | 10/2021 | Noori .................... H01L 25/072 |

* cited by examiner

100g

CHIP RADIO FREQUENCY PACKAGE AND RADIO FREQUENCY MODULE

CROSS-REFERENCE TO RELATED APPLICATIONS

This application is a Continuation Application of U.S. patent application Ser. No. 16/891,265 filed on Jun. 3, 2020, which claims the benefit under 35 USC § 119(a) of Korean Patent Application No. 10-2020-0013914 filed on Feb. 5, 2020, in the Korean Intellectual Property Office, the entire disclosure of which is incorporated herein by reference for all purposes.

BACKGROUND

1. Field

The following description relates to a chip radio frequency package and a radio frequency module.

2. Description of Related Art

Data traffic in mobile communications systems continues to rapidly increase each year. Systems that support the transmission of such rapidly increased data in real time in wireless networks are being implemented. For example, the contents of systems such as internet of things (IoT) based data, augmented reality (AR), virtual reality (VR), live VR/AR combined with SNS, autonomous navigation, applications such as Sync View (real-time video user transmissions using ultra-small cameras), and the like may benefit from communications (e.g., 5G communications, mmWave communications, etc.) that support the transmission and reception of large amounts of data.

Additionally, millimeter wave (mmWave) communications, including 5th generation (5G) communications, are being implemented in communications systems.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a chip radio frequency package includes a substrate including a first cavity, a first connection member and a second connection member, and including a core member disposed between the first connection member and the second connection member, a radio frequency integrated circuit (RFIC) disposed on an upper surface of the substrate; and a first front-end integrated circuit (FEIC) disposed in the first cavity, wherein the core member comprises a core insulating layer and a core via disposed to penetrate the core insulating layer, the first connection member has a first stacked structure in which at least one first insulating layer and at least one first wiring layer are alternately stacked, and the first wiring layer is electrically connected to the core via, the second connection member has a second stacked structure in which at least one second insulating layer and at least one second wiring layer are alternately stacked, and the second wiring layer is electrically connected to the core via, the RFIC is configured to input or output a base signal and a first radio frequency (RF) signal which has a frequency higher than a frequency of the base signal, through the at least one second wiring layer, and the first FEIC is configured to input or output the first RF signal and a second RF signal which has a power different from a power of the first RF signal.

The first connection member is disposed on a lower surface of the core member, and the second connection member is disposed on an upper surface of the core member.

The chip radio frequency package may include a third connection member having a third stacked structure in which at least one third insulating layer and at least one third wiring layer are alternately stacked, and the third connection member is disposed on a lower surface of the first connection member, wherein the first FEIC may be disposed on an upper surface of the third connection member.

The first FEIC may be configured to input or output the first and second RF signals in a downward direction.

The first connection member may be disposed below the core member, the second connection member is disposed above the core member, and the third connection member is disposed below the core member.

The first connection member may be disposed below the core member, and the second connection member is disposed above the core member.

The first FEIC may be surrounded by the core member and the first connection member, and is disposed on a lower surface of the second connection member.

A horizontal width of a portion corresponding to an upper surface of the core member in the first cavity may be less than a horizontal width of a portion corresponding to a lower surface of the core member.

The substrate may further include a cavity cover layer in which at least a portion thereof is disposed on an upper surface of the first cavity, and the cavity cover layer is surrounded by one or more of the core member and the second connection member.

The cavity cover layer may be electrically connected to the RFIC.

The chip radio frequency package may further include a second FEIC disposed in a second cavity of the substrate, wherein a portion of the cavity cover layer is disposed on an upper surface of the second cavity.

The chip radio frequency package may further include a second FEIC disposed in a second cavity of the core member.

The first cavity and the second cavity may be spaced apart from each other, and respective side surfaces of the first cavity and the second cavity may be inclined.

The second FEIC may be configured to input or output a third RF signal and a fourth RF signal, wherein the fourth RF signal has a power that is different from a power of the third RF signal, and frequencies of the third RF signal and the fourth RF signal may be different from frequencies of the first RF signal and the second RF signal.

The second FEIC may be configured to receive a third RF signal, amplify the third RF signal, and output a fourth RF signal, the first FEIC is configured to amplify the first RF signal, and output the second RF signal, and the RFIC is configured to convert a base signal into the first RF signal, and convert the fourth RF signal into a base signal.

At least a portion of at least one of the first FEIC and the second FEIC may overlap the RFIC in a vertical direction.

In a general aspect, a radio frequency module includes a first substrate including a first cavity, a first connection member and a second connection member, and including a core member disposed between the first connection member and the second connection members; a radio frequency integrated circuit (RFIC) disposed on an upper surface of the first substrate; a first front-end integrated circuit (FEIC) disposed in the first cavity; a second substrate having an upper surface on which the first substrate is disposed; and an electrical connection structure configured to form an electrical connection between the second substrate and the first substrate, wherein the core member comprises a core insulating layer and a core via disposed to penetrate the core insulating layer, the first connection member has a first stacked structure in which at least one first insulating layer and at least one first wiring layer are alternately stacked, and the at least one first wiring layer is electrically connected to the core via, the second connection member has a second stacked structure in which at least one second insulating layer and at least one second wiring layer are alternately stacked, and the at least one second wiring layer is electrically connected to the core via, the RFIC is configured to input or output a base signal and a first radio frequency (RF) signal which has a frequency higher than a frequency of the base signal, through the at least one second wiring layer, and the first FEIC is configured to input or output the first RF signal and a second RF signal, which has a power different from a power of the first RF signal, to the second substrate.

The first connection member is disposed on a lower surface of the core member, and the second connection member is disposed on an upper surface of the core member.

The second substrate may include a patch antenna pattern configured to transmit or receive the first RF signal or the second RF signal; and a feed via connected to the patch antenna pattern.

The radio frequency module may include a second FEIC disposed in a second cavity of the core member.

The radio frequency module may include an encapsulant that encapsulates at least a portion of the RFIC on an upper surface of the first substrate.

A lower surface of the first substrate may be smaller than an upper surface of the second substrate.

In a general aspect, a radio frequency module includes a substrate including a first cavity and a second cavity; a radio frequency integrated circuit (RFIC) configured to process a base signal and a first radio frequency (RF); a first front-end integrated circuit (FEIC) disposed in the first cavity, and configured to input or output the first radio frequency (RF) signal and a second RF signal; a second FEIC disposed in the second cavity, and configured to input or output a third RF signal and a fourth RF signal, wherein a fundamental frequency of the first RF signal and the second RF signal is different from a fundamental frequency of the third RF signal and the fourth RF signal.

Other features and aspects will be apparent from the following detailed description, the drawings, and the claims.

Figure 1A:
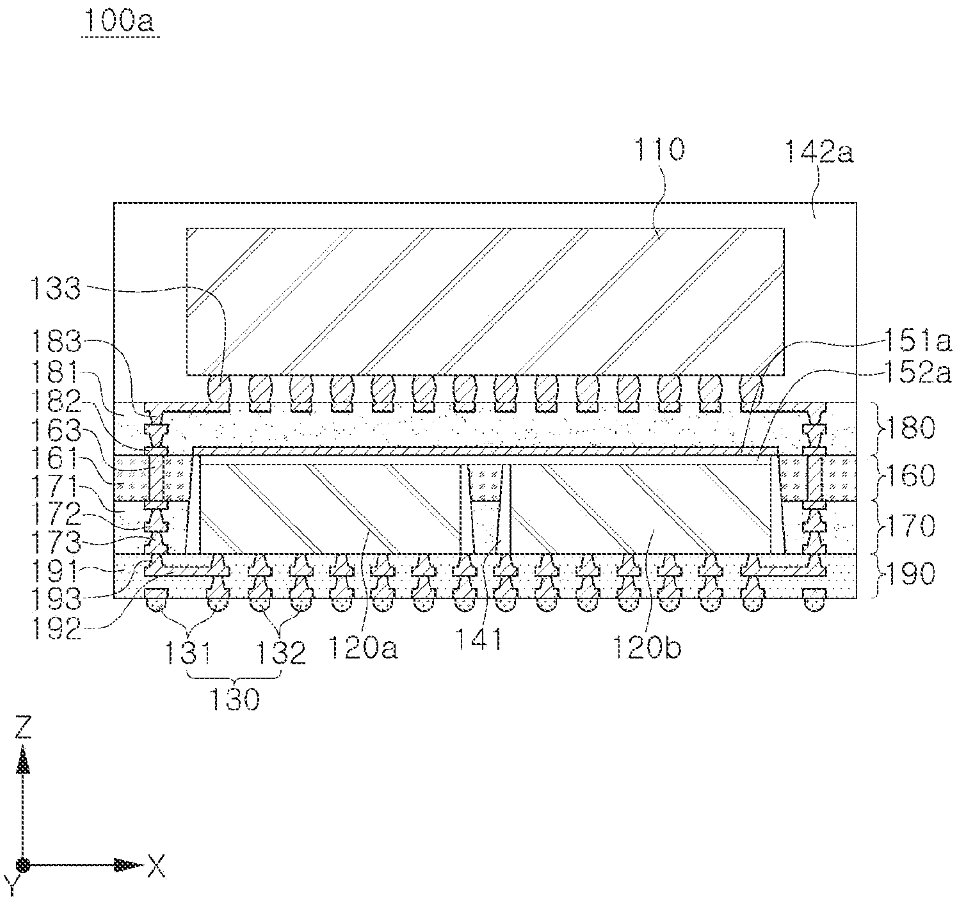
FIGS. 1A to 1D are side views illustrating an example chip radio frequency package according to one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known, after an understanding of the disclosure of the application, may be omitted for increased clarity and conciseness.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains after an understanding of the disclosure of this application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

FIG. 1A is a side view illustrating an example chip radio frequency package, in accordance with one or more embodiments.

Referring to FIG. 1A, a radio frequency chip package 100*a*, in accordance with one or more embodiments, may include a radio frequency integrated circuit (RFIC) 110, a first front-end integrated circuit (FEIC) 120*a*, and a second FEIC 120*b*. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The RFIC 110 may input and/or output a base signal and a first radio frequency (RF) signal having a frequency higher than a frequency of the base signal.

For example, the RFIC 110 may process the base signal (e.g., frequency conversion, filtering, phase control, etc.) to generate a first RF signal, and process the first RF signal to generate a base signal.

The first FEIC 120*a* may input and/or output the first RF signal and a second RF signal having a power different from a power of the first RF signal.

For example, the first FEIC 120*a* may amplify a first RF signal to generate a second RF signal, and amplify a second RF signal to generate a first RF signal. In a non-limited example, the amplified second RF signal may be remotely transmitted by an antenna, and the second RF signal remotely received from the antenna may be amplified by the first FEIC 120*a*.

In an example, the first FEIC 120*a* may include at least a portion of a power amplifier, a low noise amplifier, and a transmission/reception conversion switch. The power amplifier, the low-noise amplifier, and the transmission/reception conversion switch may be implemented as a combination structure of a semiconductor transistor element and an impedance element, but is not limited thereto.

Since the first FEIC 120*a* may amplify the first RF signal and/or the second RF signal, the RFIC 110 may not include a front-end amplification circuit (e.g., a power amplifier, a low noise amplifier).

Since securing the performance (e.g., power consumption, linearity characteristics, noise characteristics, size, gain, etc.) of the front-end amplification circuit may be more difficult than securing the performance of a circuit performing operations other than amplification in the RFIC 110, compatibility of a circuit performing operations, other than amplification in the RFIC 110, may be relatively low.

In an example, the front-end amplification circuit may be implemented as a type of IC, other than a typical CMOS-based IC (for example, a compound semiconductor), or may be configured to have an efficient structure to receive impedance of a passive element, or may be optimized for a specific required performance to be implemented separately, thereby securing performance.

Accordingly, a chip radio frequency package 100*a*, in accordance with one or more embodiments, may have a structure in which the first FEIC 120*a* that performs a front-end amplification operation and the RFIC 110 that performs an operation other than the front-end amplification are implemented separately. As a result, the performance of the amplification circuit and the performance of a circuit performing operations other than front-end amplification of the RFIC 110 may be achieved.

Additionally, power consumption and/or heat generation of the front-end amplification circuit may be greater than power consumption and/or heat generation of the circuit that performs operations other than the front-end amplification of the RFIC 110.

The chip radio frequency package 100*a*, in accordance with one or more embodiments, may have a structure in which the first FEIC 120*a* that performs the front-end amplification operation, and the RFIC 110 that performs operations other than the front-end amplification are implemented separately, such that power consumption efficiency may be increased, and a heat generation path may be more efficiently distributed.

Energy loss when transmitting the first RF signal and/or the second RF signal may increase as the power of the first RF signal and/or the second RF signal increases.

In an example in which the first FEIC 120*a* or the second FEIS 120*b* that performs an front-end amplification operation and the RFIC 110 that performs operations other than the front-end amplification, since the FEIC 120 may be electrically connected closer to an antenna, an electrical length of a transmission path to an antenna of the final amplified second RF signal may be shortened more easily, and energy efficiency of the chip radio frequency package 100*a* may be further improved.

Although, in an example, a total size of the RFIC 110 and the first FEIC 120*a* may be greater than the size of the RFIC integrated with the front-end amplification circuit, the chip radio frequency package 100*a*, in accordance with one or more embodiments, may have a structure in which the RFIC 110 and the first FEIC 120*a* may be disposed in a compressed manner.

Referring to FIG. 1A, a chip radio frequency package 100*a*, in accordance with one or more embodiments, may include a substrate, and the substrate may include a core member 160, a first connection member 170, and a second connection member 180.

In an example, the core member 160 may include a core insulating layer 161 and a core via 163 disposed to penetrate the core insulating layer 161.

In an example, the first connection member 170 may have a first stacked structure in which at least one first insulating layer 171 and at least one first wiring layer 172 are alternately stacked. The at least one first wiring layer 172 may be electrically connected to the core via 163, and may be disposed on a lower surface of the core member 160.

In an example, the first connection member 170 may have a structure built up in a downward direction of the core member 160. In other words, the first connection member 170 may be disposed below the core member 160. Therefore, a first via 173, that may be included in the first connection member 170, may have a structure in which a width of a lower end thereof is longer than, or greater than, a width of an upper end thereof.

The second connection member 180 may have a second stacked structure in which at least one second insulating layer 181 and at least one second wiring layer 182 are alternately stacked. The at least one second wiring layer 182 may be electrically connected to the core via 163, and may be disposed on an upper surface of the core member 160.

In an example, the second connection member 180 may have a structure that is built up in an upward direction of the core member 160. In other words, the second connection member 180 may be disposed above the core member 160. Therefore, a second via 183, that may be included in the second connection member 180, may have a structure in which a width of an upper end thereof is longer than, or greater than, a width of a lower end thereof.

The RFIC 110 may be disposed on an upper surface of the second connection member 180, and may input and/or output a base signal and a first RF signal, through at least one second wiring layer 182.

The core member 160 and the first connection member 170 may surround a first cavity in which the first FEIC 120*a* is disposed in a horizontal direction (e.g., an x-direction, a y-direction), and the second connection member 180 may be disposed to overlap in a vertical direction (e.g., a z-direction) in the first cavity. That is, the first cavity may have a recessed structure having a same thickness of the substrate.

Accordingly, since the RFIC 110 and the first FEIC 120*a* may be disposed in a compressed manner with each other, an actual size of the chip radio frequency package 100*a* in accordance with one or more embodiments may be reduced, and may be less than or equal to the size of a chip radio frequency package implemented with an RFIC integrated with a front-end amplification circuit.

Additionally, since the second connection member 180 may be disposed between the RFIC 110 and the first FEIC 120*a*, electromagnetic isolation between the RFIC 110 and the first FEIC 120*a* may be improved.

Referring to FIG. 1A, a radio frequency chip package 100*a*, in accordance with one or more embodiments, may further include a third connection member 190 disposed on a lower surface of the first connection member 170.

The third connection member 190 may have a third stacked structure in which at least one third insulating layer 191 and at least one third wiring layer 192 are alternately stacked.

In an example, the third connection member 190 may have a structure that is built up in a downward direction of the core member 160. In other words, the third connection member 190 may be disposed below the core member 160, and below the first connection member. Therefore, a third via 193, that may be included in the third connection member 190, may have a structure in which a width of a lower end thereof is longer than, or greater than, a width of an upper end thereof.

A plurality of electrical connection structures 130 may be disposed on the lower surface of the third connection member 190. In a non-limiting example, the plurality of electrical connection structures 130 may be implemented with solder balls, pads, or lands.

A first FEIC 120*a* may be disposed on the upper surface of the third connection member 190.

In an example, the first FEIC 120*a* may input or output first and second RF signals in a downward direction. Accordingly, since wiring complexity of the second connection member 180 may be reduced, the second connection member 180 may stably provide a dispositional space of the wiring electrically connected to the RFIC 110. Additionally, electromagnetic isolation between the RFIC 110 and the first FEIC 120*a* may be further improved.

The first electrical connection structure 131 of the plurality of electrical connection structures 130 may provide an electrical connection path to the exterior of the RFIC 110, and the second electrical connection structure 132 thereof may provide an electrical connection path to the exterior of the first FEIC 120*a*.

Referring to FIG. 1A, the chip radio frequency package 100*a*, in accordance with one or more embodiments, may further include a cavity cover layer 151*a* in which at least a portion thereof is disposed on an upper surface of a first cavity, and is surrounded by a core member 160 or a second connection member 180 in a horizontal direction (e.g., an x-direction, or a y-direction).

The cavity cover layer 151*a* may be used as a stopper to stop a process of forming a first cavity. Therefore, a difference between a height of the first cavity and a height of the first FEIC 120*a* may be reduced. Accordingly, since the first FEIC 120*a* and the RFIC 110 may be more compressively disposed, an actual size of the chip radio frequency package 100*a* may be further reduced.

In an example, an adhesive layer 152*a* may be disposed between the cavity cover layer 151*a* and the first FEIC 120*a*, so that the first FEIC 120*a* may be stably adhered to the lower surface of the cavity cover layer 120*a*.

In a non-limiting example, the side surface of the first cavity may be inclined. That is, an inner wall facing the first FEIC 120*a* from the core member 160 and the first connection member 170 may be inclined. Specifically, in an example, a horizontal width of a portion corresponding to the upper surface of the core member 160 in the first cavity may be smaller than a horizontal width of a portion corresponding to the lower surface of the core member 160.

The inclined side surface of the first cavity may be formed due to an asymmetrical structure in the vertical direction of the first cavity in the substrate according to which the first cavity is not formed in the second connection member 180.

In an example, a first encapsulant 141 may be filled in a portion of the first cavity where the first FEIC 120*a* is not positioned.

In an example, a second encapsulant 142*a* may encapsulate at least a portion of the RFIC 110 on the upper surface of the second connection member 180. Accordingly, in an example, the chip radio frequency package 100*a* may be a standardized electronic component, and may have a structure that is easy to be mass-produced, distributed, and used, and the RFIC 110 may be protected from the external influences.

Referring to FIG. 1A, a chip radio frequency package 100*a*, in accordance with one or more embodiments, may further include a second FEIC 120*b*.

The core member 160 and the first connection member 170 may surround a second cavity in which the second FEIC 120*b* may be disposed in a horizontal direction (e.g., an x-direction, or a y-direction), and the second connection member 180 may be disposed to overlap in a vertical direction (e.g., a z-direction) in the second cavity. That is, the second cavity may have a structure that is recessed by a thickness of the substrate.

At least a portion of at least one of the first FEIC 120*a* and the second FEIC 120*b* may overlap the RFIC 110 in the vertical direction (e.g., the z-direction).

In an example, the first FEIC 120*a* and the second FEIC 120*b* may be disposed in the first and second cavities, which are spaced apart from each other. Accordingly, electromagnetic isolation between the first FEIC 120*a* and the second FEIC 120*b* may be improved, and each of the first FEIC 120*a* and the second FEIC 120*b* may dissipate heat more efficiently.

In an example, since the first and second cavities may be formed substantially simultaneously, a cavity cover layer 151*a* may be disposed to overlap both the first and second cavities in the vertical direction (e.g., the z-direction).

For example, since the second cavity may have the same shape as the first cavity, a side surface of the second cavity may be inclined.

When the total horizontal width of the first and second cavities is greater relative to the total horizontal width of the substrate, structural stability of the substrate may be decreased, and warpage of the substrate may be increased.

When the first and second cavities have an asymmetrical structure in the vertical direction in the substrate, the total horizontal width of the first and second cavities relative to the total horizontal width of the substrate may be widened more easily than the total horizontal width of the first and second cavities when the first and second cavities are formed to penetrate the entire substrate.

Therefore, the chip radio frequency package 100*a*, in accordance with one or more embodiments, may stably include the first and second cavities even if it has a relatively small horizontal width, and may use the first FEIC 120*a* and the second FEIC 120*b* together, even if it has a relatively small horizontal width.

The second FEIC 120*b* may input and/or output a third RF signal and a fourth RF signal, where the fourth RF signal may have a power different from a power of the third RF signal.

In an example, a fundamental frequency of the first and second RF signals input and/or output from the first FEIC 120*a* may be different from a fundamental frequency of the third and fourth RF signals input and/or output from the second FEIC 120*b*.

That is, the chip radio frequency package 100*a*, in accordance with one or more embodiments, may support multi-frequency band communication. Since the chip radio frequency package 100*a* may use the first FEIC 120*a* and the second FEIC 120*b* together, even if it has a relatively small horizontal width, multiple-frequency band communication may be supported efficiently, even if it has a relatively small horizontal width.

In an example, the first FEIC 120*a* may amplify a first RF signal to output a second RF signal, and the second FEIC 120*b* may receive a third RF signal and amplify the third RF signal to output a fourth RF signal. The RFIC 110 may convert a base signal into a first RF signal, and convert a fourth RF signal into a base signal.

That is, the first FEIC 120*a* may be used for signal transmission, and the second FEIC 120*b* may be used for signal reception. Accordingly, since the first FEIC 120*a* and the second FEIC 120*b* may not include a switch for switching between transmission and reception, respectively, they may have a further reduced size. Accordingly, the size of the chip radio frequency package 100*a* may be further reduced.

Figure 1B:
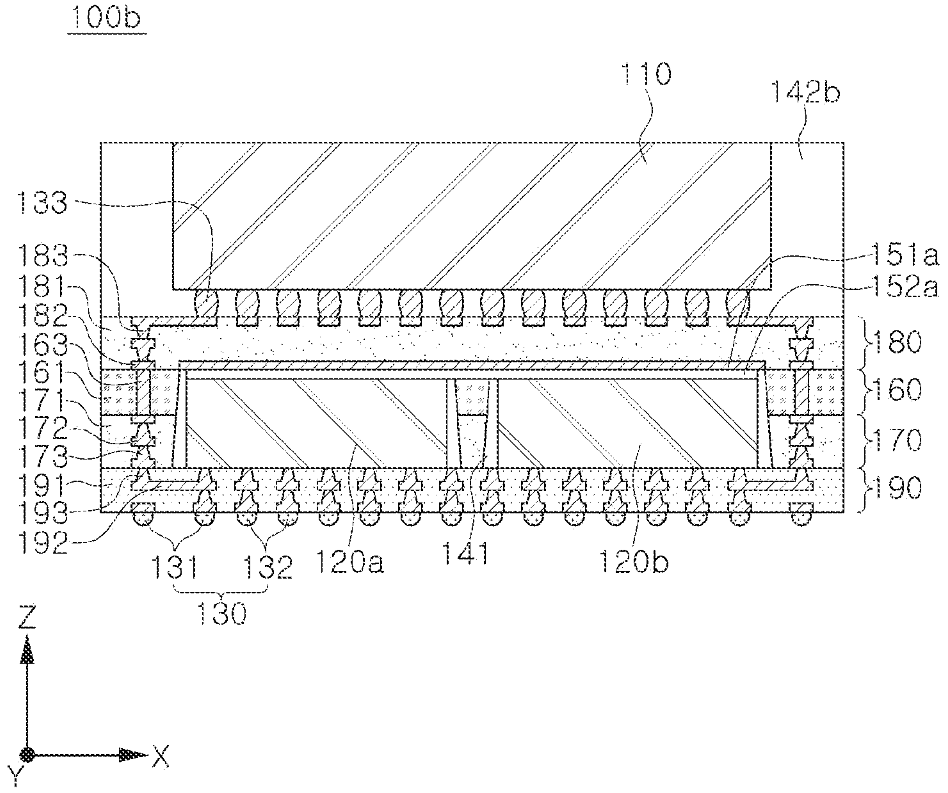
Figure 1C:
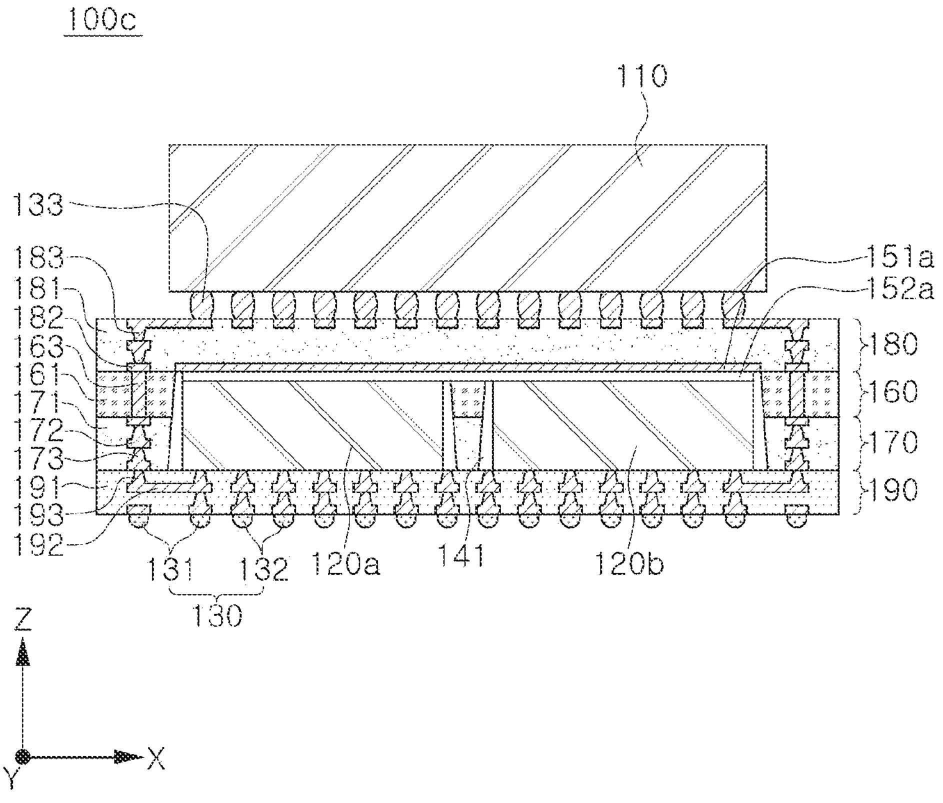
Figure 1D:
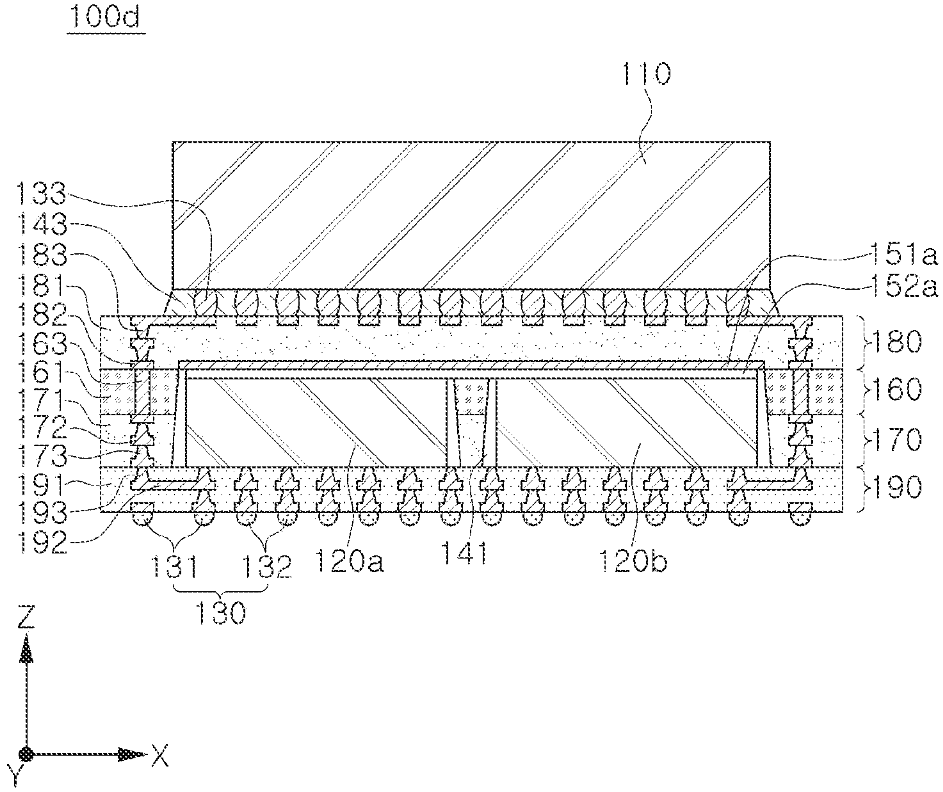

FIGS. 1B to 1D are side views illustrating an example chip radio frequency package, in accordance with one or more embodiments.

Referring to FIG. 1B, an example chip radio frequency package 100*b*, in accordance with one or more embodiments, may include a second encapsulant 142*b*, which may have a shorter thickness than the second encapsulant 142*a* illustrated in FIG. 1A.

Referring to FIG. 10, an example chip radio frequency package 100*c*, in accordance with one or more embodiments, may have a structure in which the second encapsulant 142*a* and 142*b* respectively illustrated in FIG. 1A or 1B, is omitted.

Referring to FIG. 1D, an example chip radio frequency package 100*d*, in accordance with one or more embodiments, may include a third encapsulant 143 encapsulating a plurality of third electrical connection structures 133. The plurality of third electrical connection structures 133 may be mounted on the upper surface of the second connection member 180 of the RFIC 110.

Figure 2A:
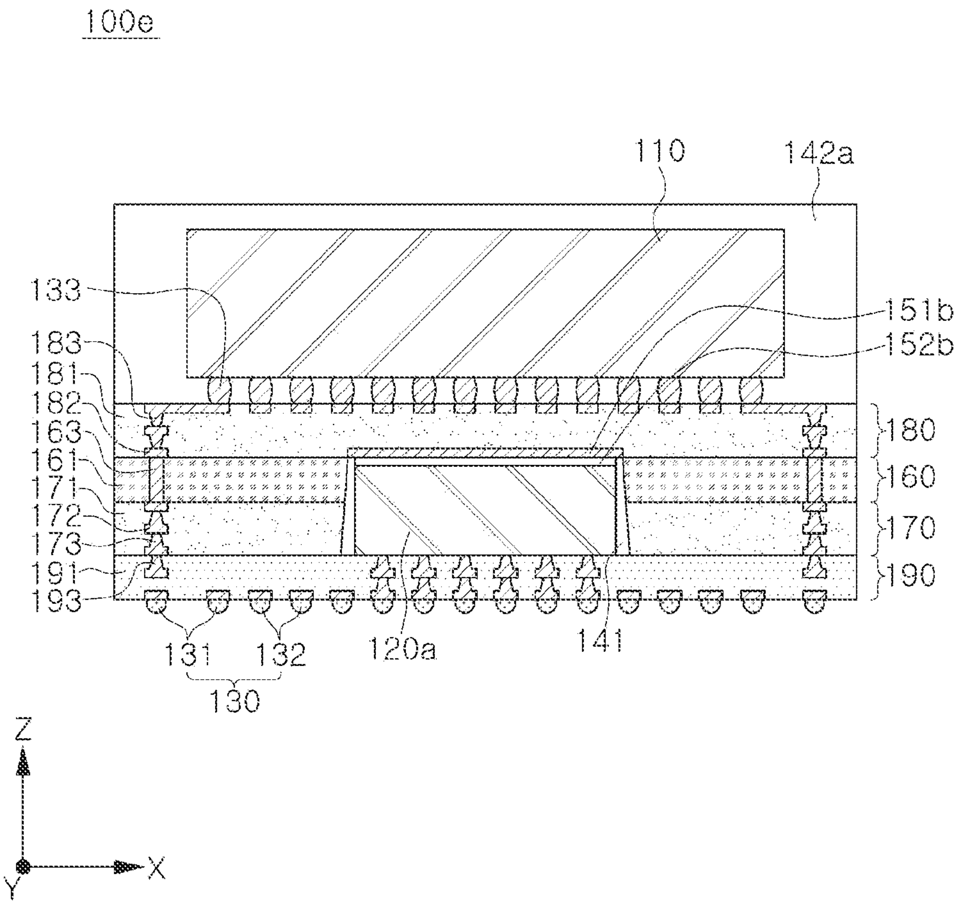
FIGS. 2A to 2C are side views illustrating an example chip radio frequency package according to one or more embodiments.
Figure 2B:
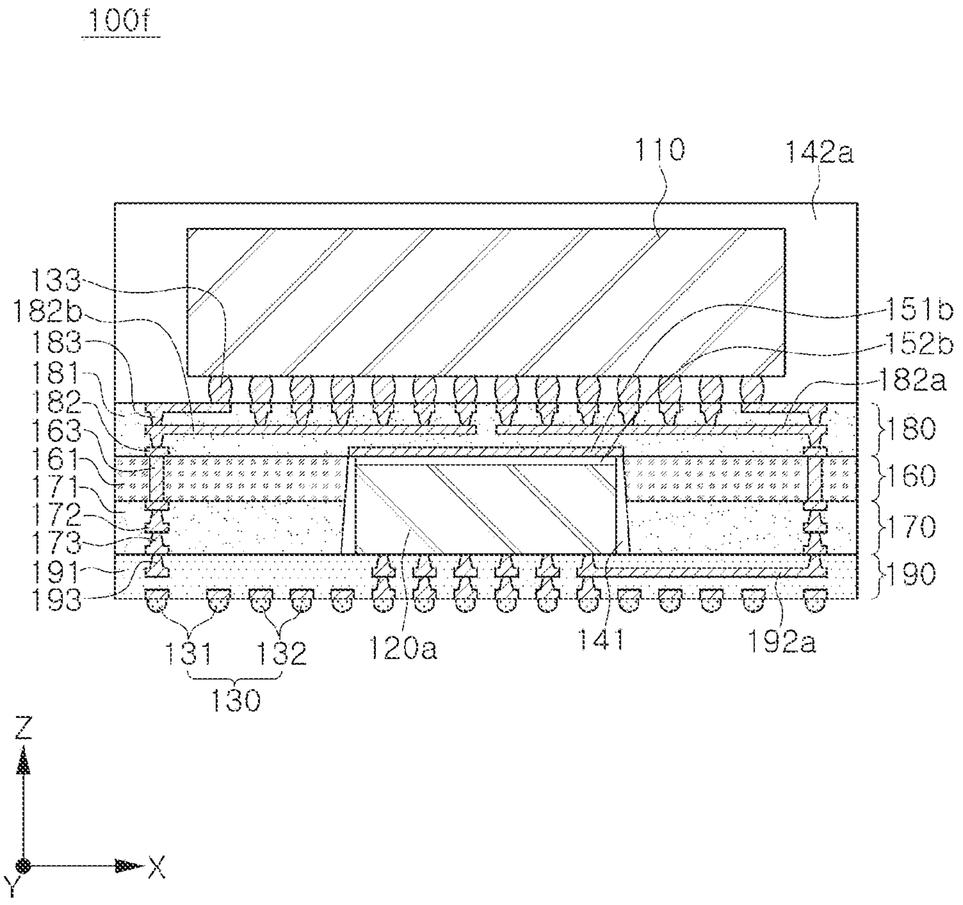
Figure 2C:
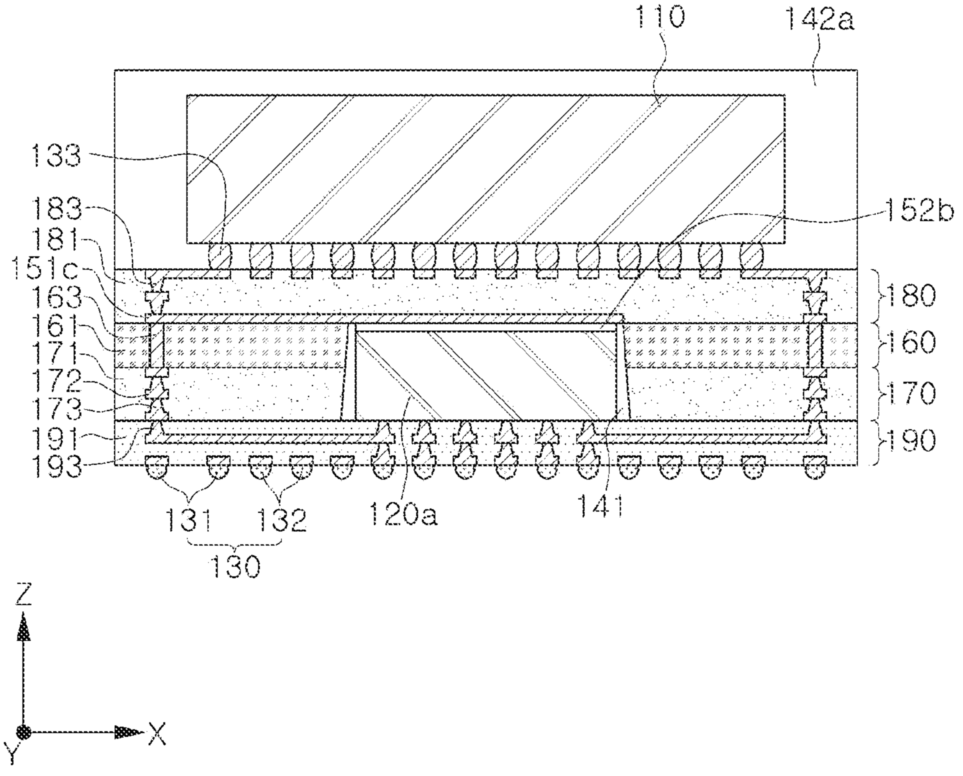

FIGS. 2A to 2C are side views illustrating an example chip radio frequency package, in accordance with one or more embodiments.

Referring to FIG. 2A, an example chip radio frequency package 100*e*, in accordance with one or more embodiments, may have a structure in which the second FEIC 120*b* illustrated in FIG. 1A, is omitted.

Referring to FIG. 2B, an example chip radio frequency package 100*f*, in accordance with one or more embodiments, may include second wiring layers 182*a* and 182*b* modified in a structure of at least one second wiring layer shown in FIG. 1A, and may have a third wiring layer 192*a* modified in a structure of at least one third wiring layer shown in FIG. 1A.

Referring to FIG. 2C, an example chip radio frequency package 100*g*, in accordance with one or more embodiments, may include a cavity cover layer 151*c* electrically connected to at least one second via 183. That is, the cavity cover layer 151*c* may be electrically connected to the RFIC 110.

In an example, the cavity cover layer 151*c* may be in an electrically stable ground state, thereby providing a ground to the RFIC 110. Since the cavity cover layer 151*c* may have a relatively wide horizontal width, the cavity cover layer 151*c* may have a more electrically stable state, and may provide a more stable ground to the RFIC 110. Additionally, since the cavity cover layer 151*c* is an electrically stable ground state, electromagnetic isolation between the RFIC 110 and the first FEIC 120*a* may be further improved.

Figure 3:
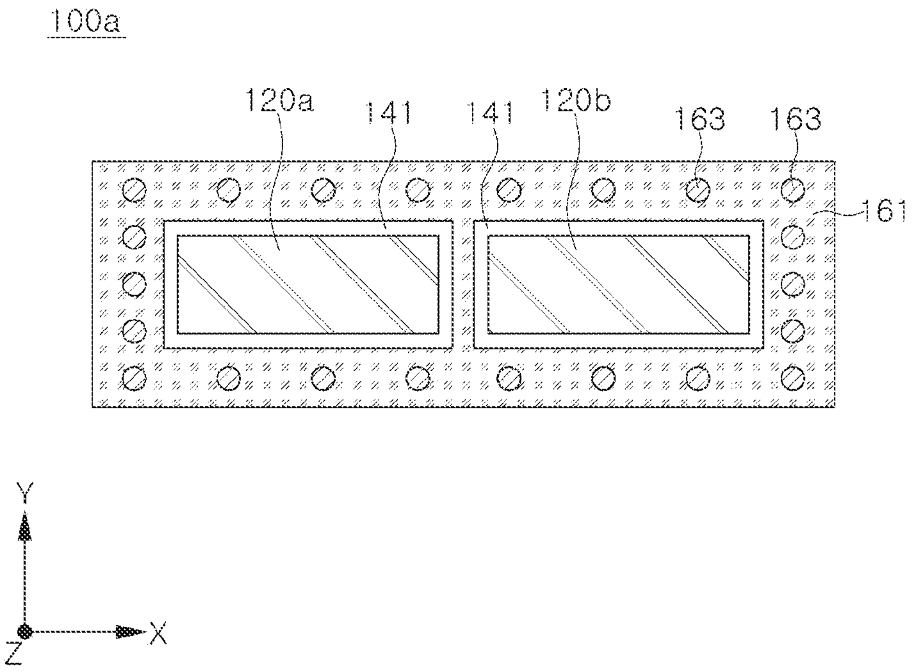
FIG. 3 is a plan view illustrating an example chip radio frequency package according to one or more embodiments.

FIG. 3 is a plan view illustrating a chip radio frequency package, in accordance with one or more embodiments.

Referring to FIG. 3, the core insulating layer 161 of the example chip radio frequency package 100*a* may surround the first FEIC 120*a* and the second FEIC 120*b*, respectively, and may include a plurality of core vias 163.

FIGS. 4A to 4D are side views illustrating an example chip radio frequency package, in accordance with one or more embodiments.

Figure 4A:
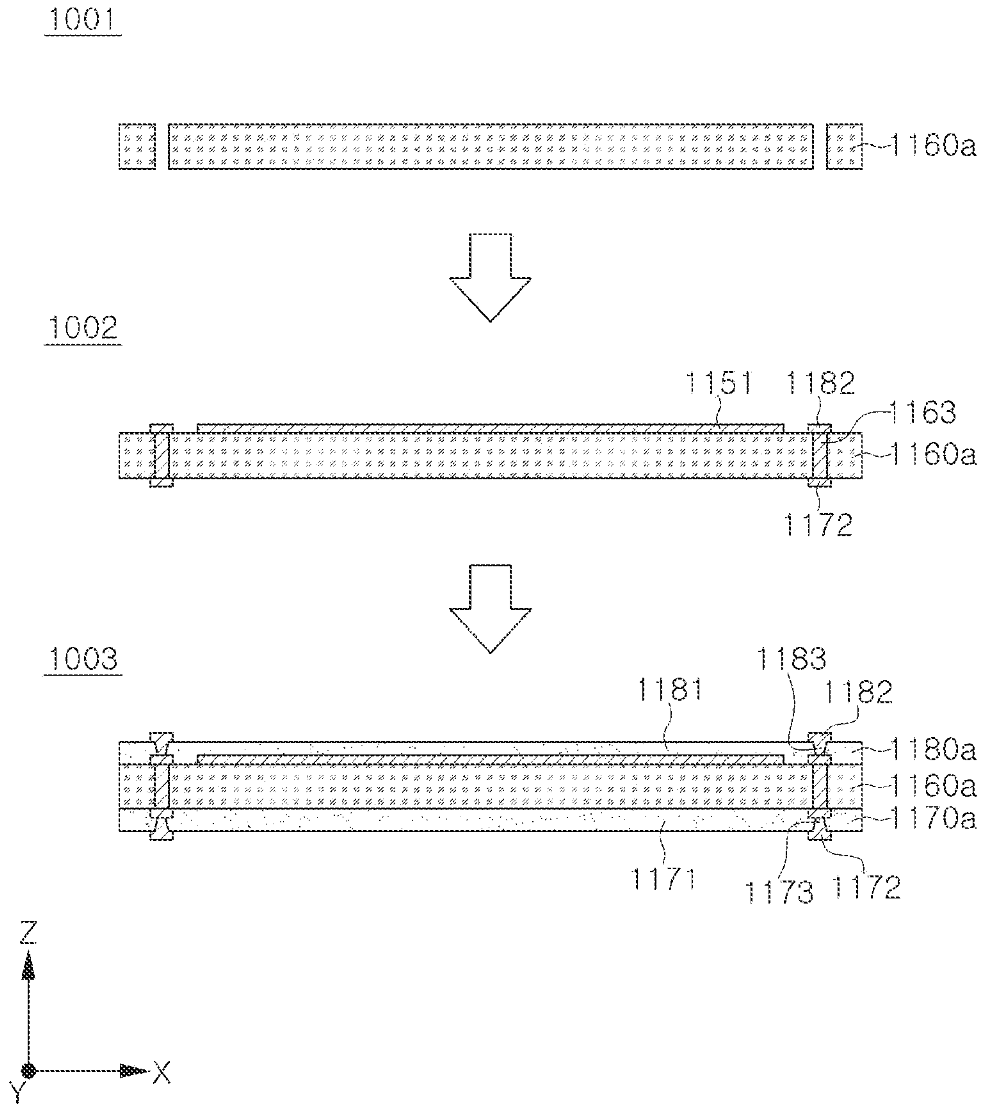
FIGS. 4A to 4D are side views illustrating a process of manufacturing a chip radio frequency package according to one or more embodiments.

Referring to FIG. 4A, in a first operation 1001, a portion in which a core via is to be disposed in a core member 1160*a* may be removed.

Referring to FIG. 4A, in a second operation 1002, the core via 1163 may be formed to penetrate the core member 1160*a*, and a cavity cover layer 1151 and a second wiring layer 1182 may be disposed on an upper surface of the core insulating member 1160*a*, and a first wiring layer 1172 may be disposed on a lower surface of the core member 1160*a*.

Referring to FIG. 4A, in a third operation 1003, a first insulating layer 1171 may be disposed on the lower surface of the core member 1160*a*, a first via 1173 may be formed in the first insulating layer 1171, a second insulating layer 1181 may be disposed on an upper surface of the core member 1160*a*, and a second via 1183 may be formed on the second insulating layer 1181. Accordingly, some layers of the first connection member 1170*a* may be formed, and some layers of the second connection member 1180*a* may be formed.

Figure 4B:
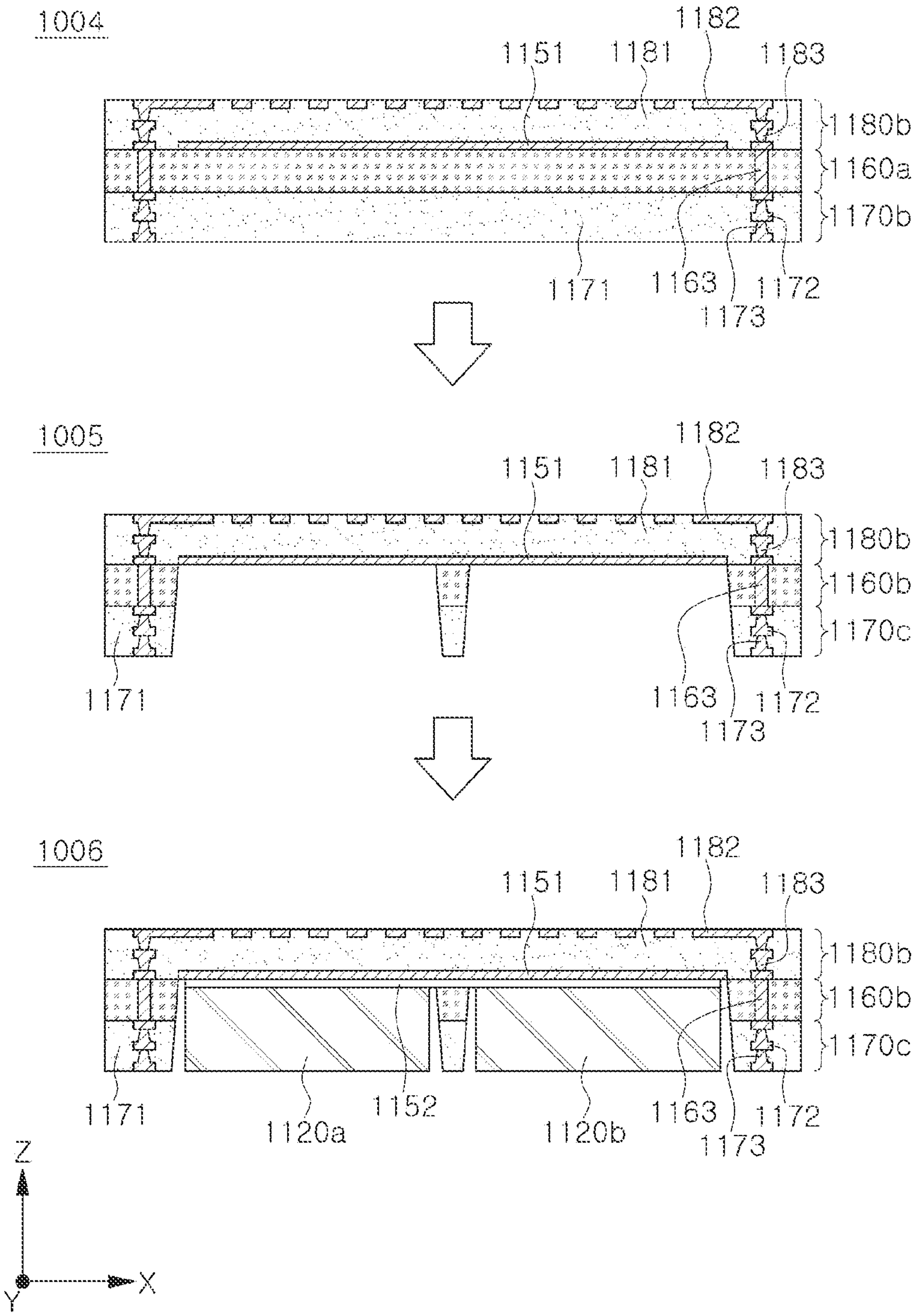

Referring to FIG. 4B, in a fourth operation 1004, a total thickness of each of the first and second insulating layers 1171 and 1181 may be thicker than a total thickness of the first and second insulating layers 1171 and 1181 as illustrated in operation 1003 of FIG. 4A, the first and second wiring layers 1172 and 1182 may be further stacked than a stacking of the first and second wiring layers 1172 and 1182 as illustrated in operation 1003 of FIG. 4A, and the first and second vias 1173 and 1183 may be longer than the first and second vias 1173 and 1183 as illustrated in operation 1003 of FIG. 4A. Accordingly, the number of stacked layers of the first connection member 1170*b* may increase, and the number of stacked layers of the second connection member 1180*b* may increase.

Referring to FIG. 4B, in a fifth operation 1005, first and second cavities may be formed in a core member 1160*b* and a first connection member 1170*c*. For example, the first and second cavities may be formed as a plurality of fine particles or lasers collide in a specific region of the core member 1160*b* and the first connection member 1170*c* in a +z-direction.

Referring to FIG. 4B, in a sixth operation 1006, an adhesive layer 1152 may be disposed in the first and second cavities, and the first and second FEICs 1120*a* and 1120*b* may be disposed in the first and second cavities, respectively.

Figure 4C:
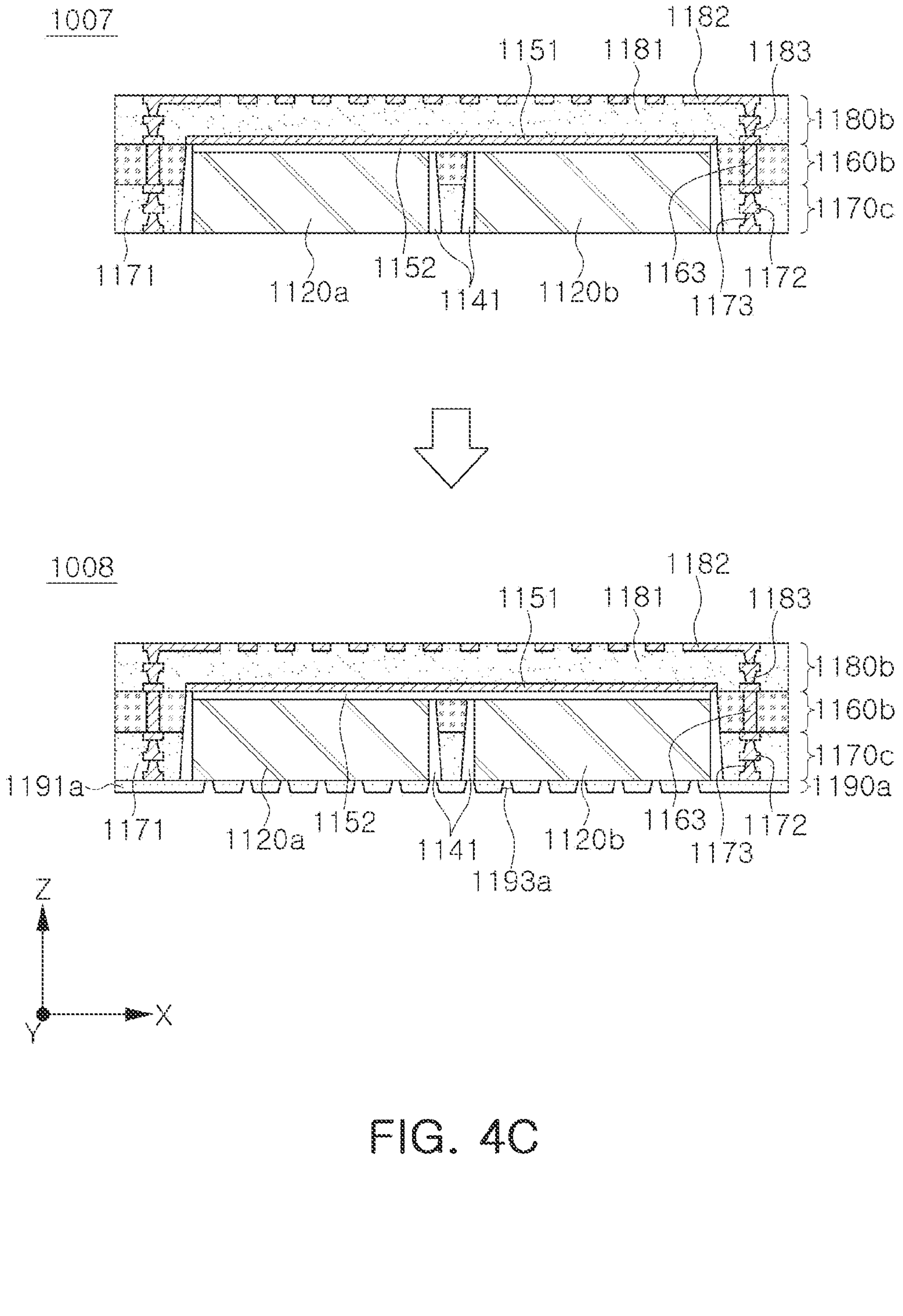

Referring to FIG. 4C, in a seventh operation 1007, a first encapsulant 1141 may be filed in a portion of the first and second cavities where the respective first and second FEICs 1120*a* and 1120*b* are not disposed.

Referring to FIG. 4C, in an eighth operation 1008, a third insulating layer 1191*a* may be disposed on a lower surface of the first connection member 1170*c*, and may have a dispositional space of the third via 1193*a*. Accordingly, some layers of the third connection member 1190*a* may be formed.

Figure 4D:
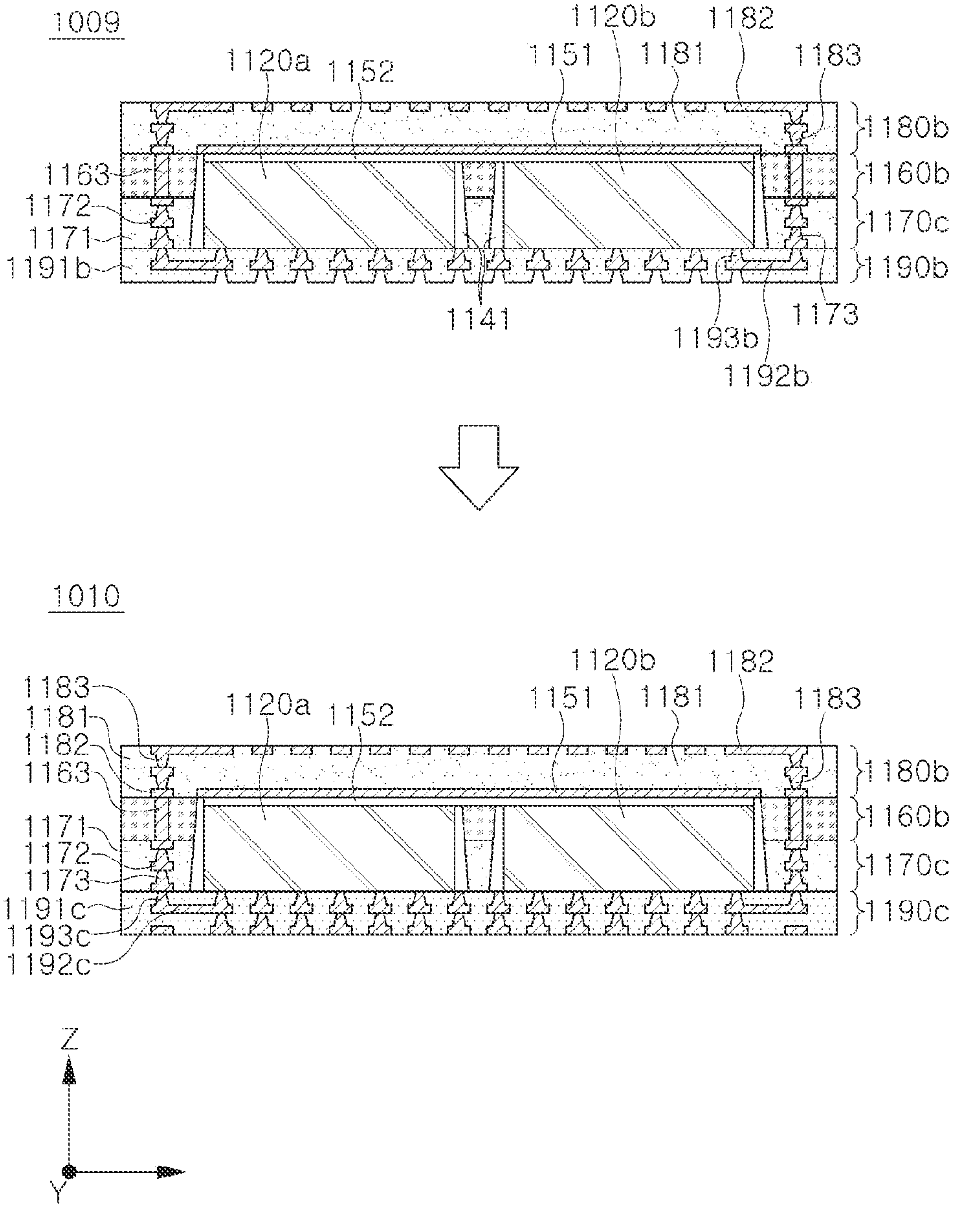

Referring to FIG. 4D, in a ninth operation 1009, a total thickness of the third insulating layer 1191*b* may be thicker than a thickness of third insulating layer 1191*a* of FIG. 4C, and the third wiring layer 1192*b* and the third via 1193*c* may be formed in the third insulating layer 1191*b*. Accordingly, the number of stacked layers of the third connection member 1190*b* may increase.

Referring to FIG. 4D, in a tenth operation 1010, the total thickness of the third insulating layer 1191*c* may be thicker than a thickness of third insulating layer 1191*a* of FIG. 4C, and the third wiring layer 1192*c* and the third via 1193*c* may be further formed in the third insulating layer 1191*c*. Accordingly, the number of stacked layers of the third connection member 1190*c* may further be increased.

Figure 5A:
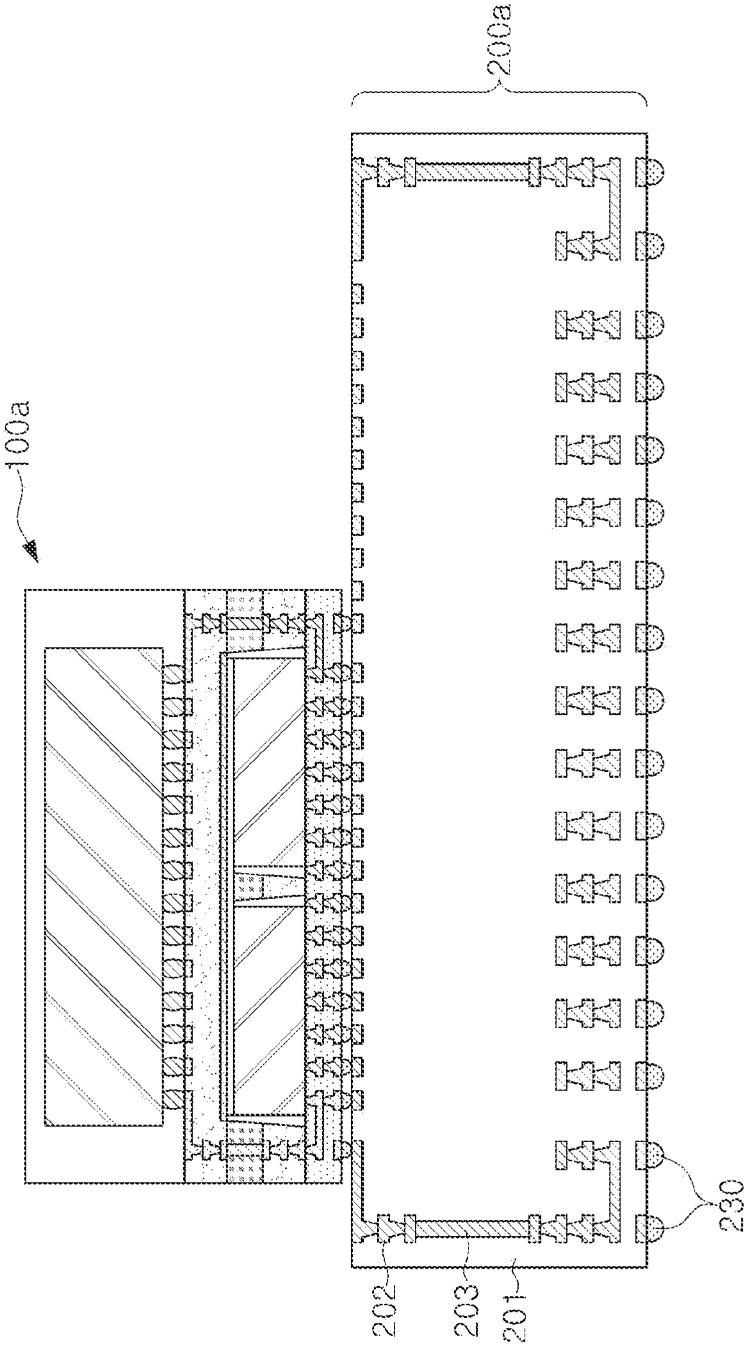
FIGS. 5A and 5B are side views illustrating an example radio frequency module according to one or more embodiments.
Figure 5B:
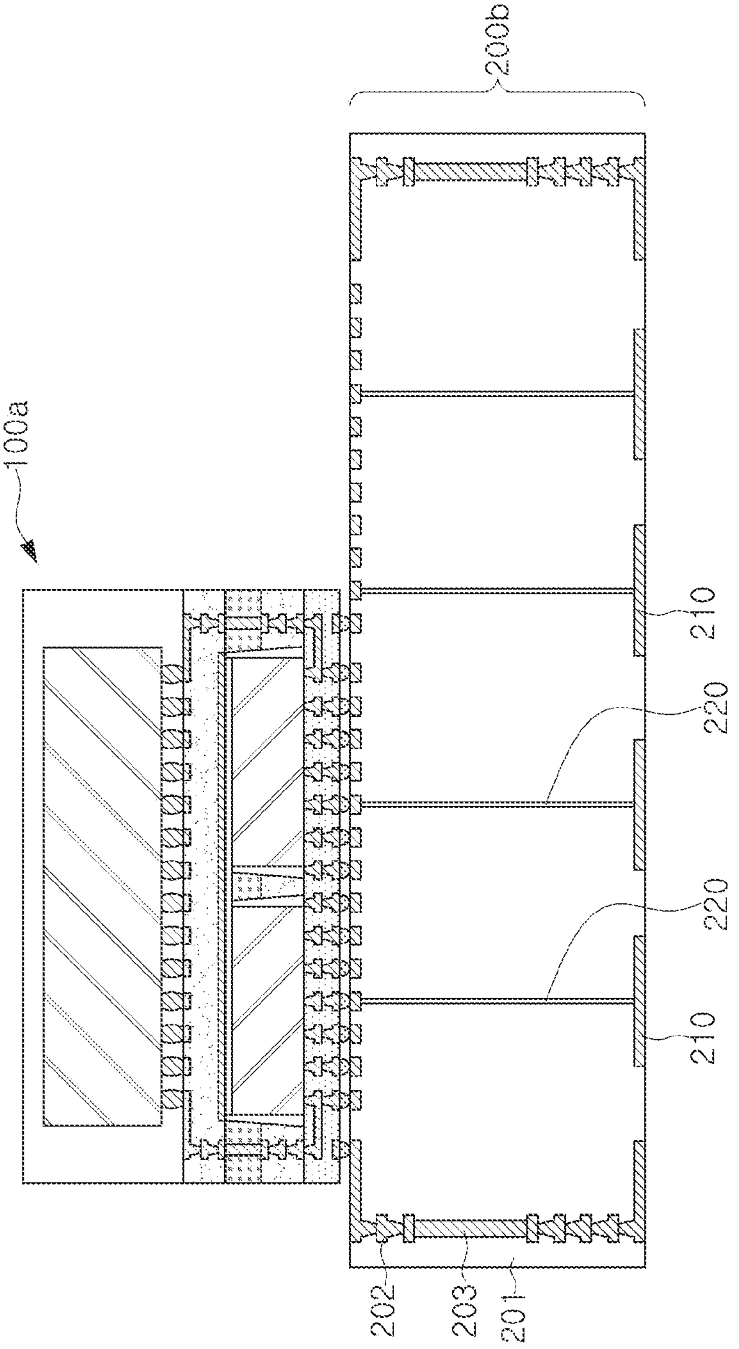

FIGS. 5A and 5B are side views illustrating an example radio frequency module, in accordance with one or more embodiments.

Referring to FIG. 5A, an example radio frequency module may include a chip radio frequency package 100*a* and a second substrate 200*a*.

The second substrate 200*a* may have a structure in which a fourth insulating layer 201, a fourth wiring layer 202, and a fourth via 203 are combined, and may have a structure similar to a structure of the printed circuit board (PCB).

As the number of stacked layers of connection members of the chip radio frequency package 100*a* increases, the number of the fourth insulating layer 201 and the fourth wiring layer 202 of the second substrate 200*a* may decrease, so that the thickness of the second substrate 200*a* may be thinned.

The chip radio frequency package 100*a* may be mounted on the upper surface of the second substrate 200*a* through the first and second electrical connection structures, and may be electrically connected to the fourth wiring layer 202 and the fourth via 203.

A horizontal width of the chip radio frequency package 100*a* may be smaller than, or less than, a width of the upper surface of the second substrate 200*a*. Therefore, the chip radio frequency package 100*a* may be used as one electronic component in terms of the second substrate 200*a*.

A plurality of fourth electrical connection structures 230 may be disposed on a lower surface of the second substrate 200*a*, and may be electrically connected to the fourth wiring layer 202 and the fourth via 203.

The plurality of fourth electrical connection structures 230 may support mounting of a chip antenna, and the chip antenna may remotely transmit and/or receive the second RF signal. Additionally, a portion of the plurality of fourth electrical connection structures 230 may be used as input and/or output paths of the base signal.

Referring to FIG. 5B, a second substrate 200*b* may further include a plurality of patch antenna patterns 210 and a plurality of feed vias 220.

The plurality of patch antenna patterns 210 may be formed together with the wiring layer of the second substrate 200*b*, may remotely transmit and/or receive the second RF signal, and may be fed from the plurality of feed vias 220.

Figure 6:
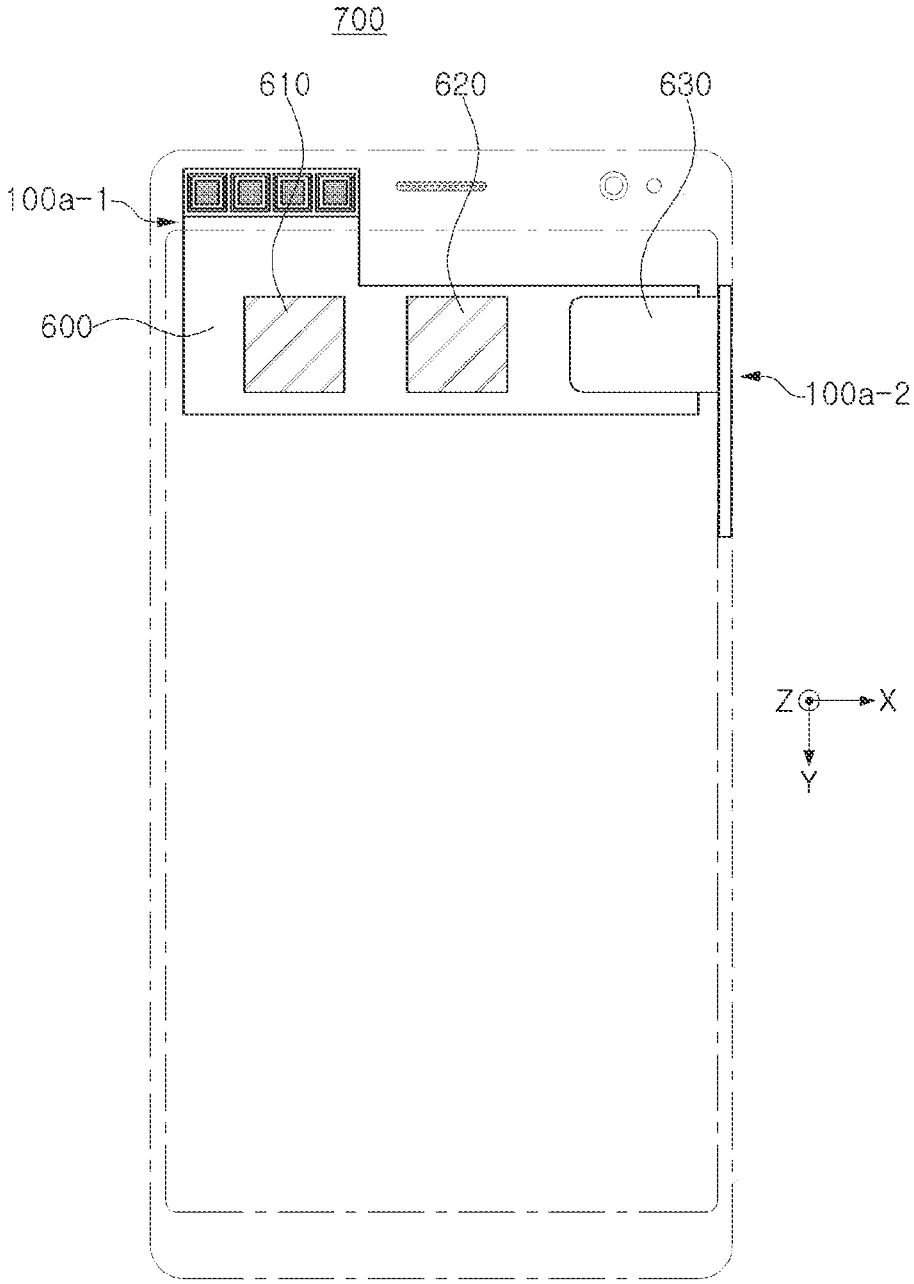
FIG. 6 is a plan view illustrating an example disposition of a radio frequency module in an electronic device according to one or more embodiments.

FIG. 6 is a plan view illustrating an example disposition of a radio frequency module in an electronic device, in accordance with one or more embodiments.

Referring to FIG. 6, example radio frequency modules 100*a*-1 and 100*a*-2 may be disposed adjacent to a plurality of different edges of an electronic device 700, respectively.

In a non-limiting example, the electronic device 700 may be a smartphone, a personal digital assistant, a digital video camera, a digital still camera, a network system, a computer, a monitor, a tablet PC, a laptop computer, a netbook computer, a television set, a video game, a smartwatch, an automobile, or may be an apparatus provided in, autonomous vehicles, robotics, smartphones, tablet devices, augmented reality (AR) devices, Internet of Things (IoT) devices, and similar devices, but the present disclosure is not limited thereto, and may correspond to various other types of devices.

The electronic device 700 may include a base substrate 600, and the base substrate 600 may further include a communication modem 610 and a baseband IC 620

The communication modem 610 may include at least a portion of: a memory chip such as at least one of a volatile memory or a nonvolatile memory. The nonvolatile memory may include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like. The volatile memory may include dynamic RAM (DRAM), static RAM (SRAM), synchronous DRAM (SDRAM), phase-change RAM (PRAM), magnetic RAM (M RAM), resistive RAM (RRAM), ferroelectric RAM (FeRAM), and the like. Furthermore, the storage device 820 may include at least one of hard disk drives (HDDs), solid state drive (SSDs), compact flash (CF) cards, secure digital (SD) cards, micro secure digital (Micro-SD) cards, mini secure digital (Mini-SD) cards, extreme digital (xD) cards, or Memory Sticks.

The communication modem 610 may include an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, to perform digital signal processing.

The baseband IC 620 may perform analog-to-digital conversion, amplification, filtering, and frequency conversion on the analog signal to generate a base signal. The base signal input/output from the baseband IC 620 may be transferred to radio frequency modules 100*a*-1 and 100*a*-2 through the coaxial cable, and the coaxial cable may be electrically connected to an electrical connection structure of the radio frequency modules 100*a*-1 and 100*a*-2.

For example, a frequency of the base signal may be within a baseband, and may be a frequency (e.g., several GHz) corresponding to an intermediate frequency (IF). A frequency of the RF signal (e.g., 28 GHz, 39 GHz) may be higher than the IF, and may correspond to a millimeter wave (mmWave).

The wiring layers, vias, and patterns, disclosed herein may be formed of metal materials (e.g., a conductive material such as copper (Cu), aluminum (Al), silver (Ag), tin (Sn), gold (Au), nickel (Ni), lead (Pb), titanium (Ti), alloys thereof, or the like), and may be formed according to plating methods such as chemical vapor deposition (CVD), physical vapor deposition (PVD), sputtering, subtractive, additive, a semi-additive process (SAP), a modified semi-additive process (MSAP), or the like, but is not limited thereto.

The insulating layer disclosed herein may be implemented by a prepreg, FR4, a thermosetting resin such as epoxy resin, a thermoplastic resin, or a resin formed by impregnating these resins in a core material such as a glass fiber, a glass cloth, a glass fabric, or the like, together with an inorganic filler, Ajinomoto Build-up Film (ABF) resin, bismaleimide triazine (BT) resin, a photoimageable dielectric (PID) resin, a copper clad laminate (CCL), a ceramic-based insulating material, or the like.

The RF signals developed herein may have a format according to Wi-Fi (IEEE 802.11 family, etc.), WiMAX (IEEE 802.16 family, etc.), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G and any other wireless and wired protocols specified thereafter, but is not limited thereto. In addition, the frequency of the RF signal (e.g., 24 GHz, 28 GHz, 36 GHz, 39 GHz, 60 GHz) is greater than the frequency of the IF signal (e.g., 2 GHz, 5 GHz, 10 GHz, etc.).

As set forth in the examples, a chip radio frequency package and a radio frequency module may have an improved processing performance for a radio frequency signal (e.g., power efficiency, amplification efficiency, frequency conversion efficiency, heat dissipation efficiency, noise robustness, or the like), or a reduced size.

While this disclosure includes specific examples, it will be apparent to one of ordinary skill in the art, after an understanding of the disclosure of this application, that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A chip radio frequency package, comprising:

a substrate including a first cavity;

a radio frequency integrated circuit (RFIC) disposed on a surface of the substrate; and a first front-end integrated circuit (FEIC) disposed in the first cavity and electrically connected to the RFIC, wherein the RFIC is configured to input or output a base signal and a first radio frequency (RF) signal which has a frequency higher than a frequency of the base signal, and the first FEIC is configured to input or output the first RF signal and a second RF signal in a downward direction, the second RF signal having a power different from a power of the first RF signal.

2. The chip radio frequency package of claim 1, wherein the first cavity has a recessed structure.

3. The chip radio frequency package of claim 1, wherein at least a portion of the first FEIC overlaps the RFIC in a vertical direction.

4. The chip radio frequency package of claim 1, wherein the substrate further comprises a cavity cover layer in which at least a portion thereof is disposed on an upper surface of the first cavity.

5. The chip radio frequency package of claim 4, wherein the cavity cover layer is electrically connected to the RFIC.

6. The chip radio frequency package of claim 4, further comprising a second FEIC disposed in a second cavity of the substrate, wherein a portion of the cavity cover layer is disposed on an upper surface of the second cavity.

7. The chip radio frequency package of claim 1, further comprising a second FEIC disposed in a second cavity of the substrate.

8. The chip radio frequency package of claim 7, wherein the first cavity and the second cavity are spaced apart from each other, and respective side surfaces of the first cavity and the second cavity are inclined.

9. The chip radio frequency package of claim 7, wherein the second FEIC is configured to input or output a third RF signal and a fourth RF signal, wherein the fourth RF signal has a power that is different from a power of the third RF signal, and frequencies of the third RF signal and the fourth RF signal are different from frequencies of the first RF signal and the second RF signal.

10. The chip radio frequency package of claim 7, wherein the second FEIC is configured to receive a third RF signal, amplify the third RF signal, and output a fourth RF signal, the first FEIC is configured to amplify the first RF signal, and output the second RF signal, and the RFIC is configured to convert a base signal into the first RF signal, and convert the fourth RF signal into a base signal.

11. The chip radio frequency package of claim 7, wherein at least a portion of at least one of the first FEIC and the second FEIC overlaps the RFIC in a vertical direction.

12. The chip radio frequency package of claim 1, wherein the substrate comprises a first connection member, a second connection member, and a core member, and wherein each of the first connection member and the second connection member is electrically connected to the core member.

13. The chip radio frequency package of claim 12, wherein the first connection member is disposed on a lower surface of the core member, and the second connection member is disposed on an upper surface of the core member.

14. The chip radio frequency package of claim 12, further comprising a third connection member disposed on a lower surface of the first connection member, wherein the first FEIC is disposed on an upper surface of the third connection member.

15. The chip radio frequency package of claim 12, wherein the first FEIC is surrounded by the core member and the first connection member, and is disposed on a lower surface of the second connection member.

16. The chip radio frequency package of claim 12, wherein a horizontal width of a portion corresponding to an upper surface of the core member in the first cavity is less than a horizontal width of a portion corresponding to a lower surface of the core member.

17. A radio frequency module, comprising:

a first substrate including a first cavity;

a radio frequency integrated circuit (RFIC) disposed on a surface of the first substrate;

a first front-end integrated circuit (FEIC) disposed in the first cavity and electrically connected to the RFIC;

a second substrate having a surface on which the first substrate is disposed; and an electrical connection structure configured to form an electrical connection between the second substrate and the first substrate, wherein the RFIC is configured to input or output a base signal and a first radio frequency (RF) signal which has a frequency higher than a frequency of the base signal, and the first FEIC is configured to input or output the first RF signal and a second RF signal in a downward direction, the second RF signal having a power different from a power of the first RF signal, to the second substrate.

18. The radio frequency module of claim 17, wherein the second substrate comprises a patch antenna pattern configured to transmit or receive the first RF signal or the second RF signal; and a feed via connected to the patch antenna pattern.

19. The radio frequency module of claim 17, further comprising a second FEIC disposed in a second cavity of the substrate.

20. The radio frequency module of claim 17, further comprising an encapsulant that encapsulates at least a portion of the RFIC on an upper surface of the first substrate.

* * * * *